United States Patent [19]
Kim

[11] Patent Number: 5,848,001
[45] Date of Patent: Dec. 8, 1998

[54] SEMIDIRECT SENSING CIRCUIT HAVING COMBINED READ AND WRITE DATA BUS

[75] Inventor: Dong Gyeun Kim, Chungcheongbuk-do, Rep. of Korea

[73] Assignee: LG Semicon Co., Ltd., Chungcheongbuk-do, Rep. of Korea

[21] Appl. No.: 874,854

[22] Filed: Jun. 13, 1997

[30] Foreign Application Priority Data

Apr. 9, 1997 [KR] Rep. of Korea .................. 13070/1997

[51] Int. Cl.⁶ ..................................................... G11C 7/00
[52] U.S. Cl. ........................... 365/190; 365/207; 365/208
[58] Field of Search .............................. 365/189.04, 190, 365/207, 208

[56] References Cited

U.S. PATENT DOCUMENTS 5,625,599 4/1997 Okamura .................................. 365/205
5,657,275 8/1997 Yoshida ............................... 365/189.05
5,703,814 12/1997 Nishimura et al. ................. 365/189.09

*Primary Examiner*—David Nelms
*Assistant Examiner*—Hien Nguyen
*Attorney, Agent, or Firm*—Birch, Stewart, Kolasch & Birch, LLP

[57] ABSTRACT

A sensing circuit, in which a semidirect system is used for simplifying a circuit system, is disclosed. The sensing circuit includes: a data bus having a data line and a data bar line for reading operations and/or writing operations; a first transistor for controlling an indirect read operation; a second and third transistor, connected to the data lines, respectively, each also being connected to the same end of said first transistor, for selectively connecting one of the data lines to the first transistor; and a fourth transistor and a fifth transistor for selectively connecting the data bus to the bit line and the bit bar line, respectively, to control a direct writing operation.

18 Claims, 3 Drawing Sheets

F I G.3
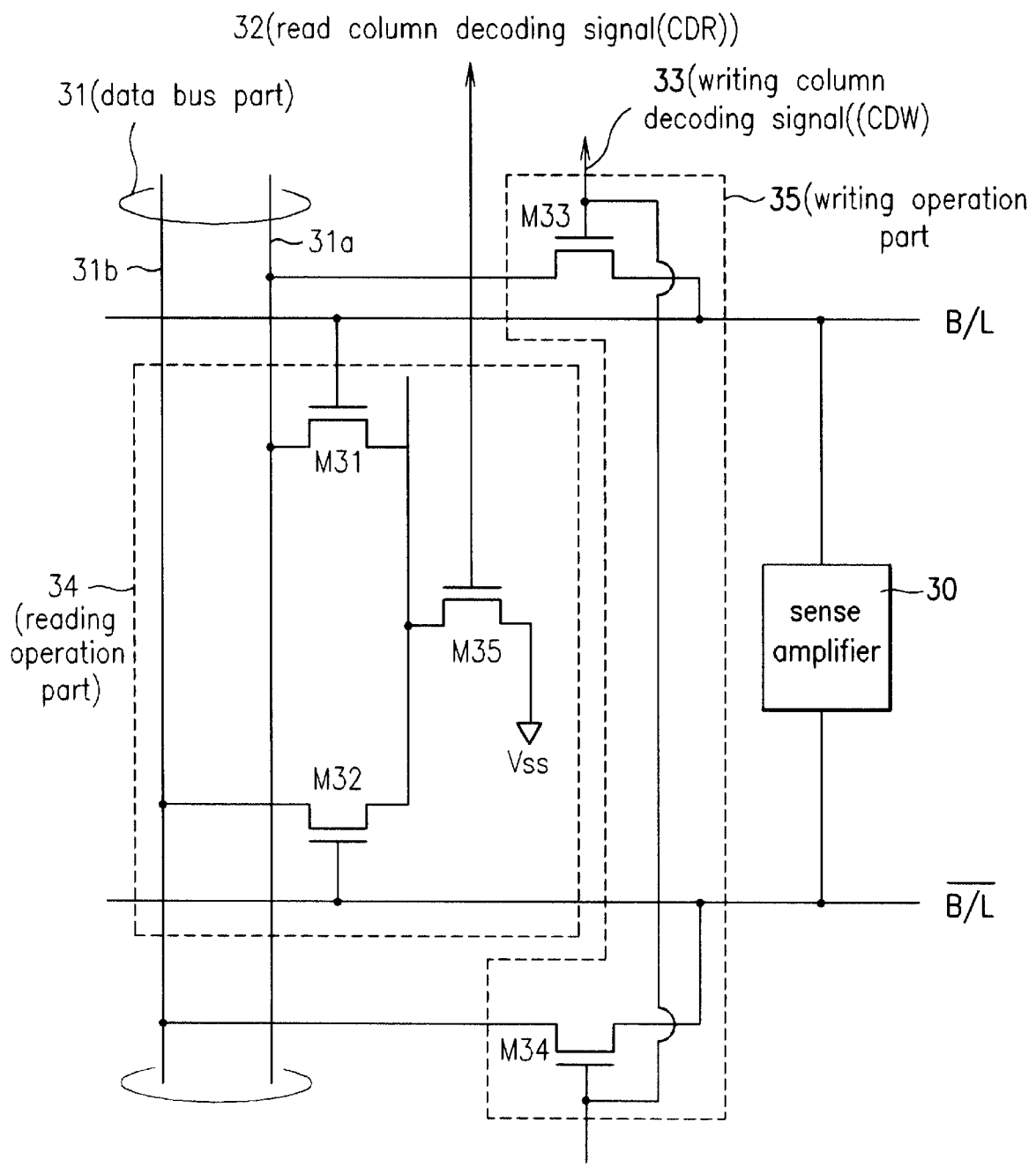

5,848,001

SEMIDIRECT SENSING CIRCUIT HAVING COMBINED READ AND WRITE DATA BUS

FIELD OF THE INVENTION

The present invention relates to a sensing circuit, and more particularly to a semidirect sensing circuit having a reduced transistor count, thereby simplifying a circuit system.

BACKGROUND OF THE INVENTION

A conventional sensing amplifier circuit for a 1-bit cell size DRAM will be explained with reference to the attached drawings. FIG. 1 illustrates a conventional direct sensing circuit. FIG. 2 illustrates a conventional indirect sensing circuit improvement upon FIG. 1.

In the conventional indirect sensing circuit of FIG. 1, the bit line (B/L) and the bit bar line (/B/L) are connected to a sense amplifier 10 and to transistors M11 and M12, respectively. The transistors M11 and M12 are connected to a data bus (DB) line and a data bus bar (/DB) line, respectively. The gates of the transistors M11 and M12 are commonly connected to a column switching (CD) signal line.

The data bus (DB) and data bus bar (/DB) lines are each precharged to ½(Vcc) prior to a read operation. A datum in a memory cell is represented by either Vcc (a logical one) or Vss (ground, or a logical zero). When the memory cell voltage is read out of the cell onto the data bus line, however, the much greater capacitance of the data bus lines (than the capacitance of the bit lines) cause the datum to make only a very small increase (indicating a logical one) or decrease (indicating a logical zero) in the magnitude of the signals on the data bus lines.

The sense amplifier of the conventional FIG. 1 had to be extremely sensitive in order to discriminate a logical one value from a logical zero value. Also, the response time of FIG. 1 was slow because the sense amplifier had to charge the bit lines and the data bus lines to their respective values after sensing the state of the cell.

The sensing circuit of conventional FIG. 2 improved upon the sensing circuit of the conventional FIG. 1a by splitting the data bus and data bus bar lines into a pair of read and read bar lines and a pair of write and write bar lines.

Referring to FIG. 2, the conventional indirect sensing circuit includes a sensing amplifier 21, a read data bus part 22, a write data bus part 23, a read out transistor part 25 for providing a data signal on the read data bus part 22 under the control of the bit line (B/L) and of the bit bar line (/B/L) during reading, and a write in transistor part 26 for providing a data signal from the write data bus part 23 under the control of the column switching signal (CD) 24 to a bit line or a bit bar line during writing. The read out transistor part 25 includes a first transistor M21, a second transistor M22 and a seventh transistor M27 for receiving a column switching signal 24. The write in transistor part 26 includes a third transistor M23 and a fifth transistor M25 both for being operative on reception of the column switching signal 24 and a fourth transistor M24 and a sixth transistor M26 for being operative on reception of a write signal WSK.

The operation of the conventional indirect sensing circuit will be explained.

In a reading operation, a datum written on the bit line or the bit bar line is amplified in the sense amplifier 21, and when a column decoding (switching) signal (Column Decoding: CD) transits from low to high, the seventh transistor M27 is turned on. Whichever of the first transistor M21 or the second transistor M22 that is connected to the high signal on the bit line or the bit bar line will be turned on and a current path from one of the lines of the read data bus part 22 to ground Vss will be formed. The turned on transistor (either M21 or M22), pulled down to the grounded terminal of the seventh transistor M27, induces a voltage difference on the read data bus part 22 by grounding the respective one of the two data bus lines that had been precharged to ½ Vcc. In this circumstance, the write in transistor part 26 is not operative because the write signal WSK is maintained at a low value.

In a writing operation in which a datum is written to the cell over the bit line or the bit bar line, the write signal WSK transitions from a low signal to a high signal to turn on the fourth transistor M24 and the sixth transistor M26. The column switching/decoding (CD) signal is also transitions from a low signal to a high signal to turn on both the third transistor M23 and the fifth transistor M25. Then, the data in the write data bus part is transferred to the bit line and the bit bar line through the turned on third, fourth, fifth and sixth transistors (M23, M24, M25 and M26). Thus, the conventional indirect sensing circuit uses a indirect sensing system, in which a data bus part is separated into the read data bus part and the write data bus part, in controlling a reading operation and a writing operation.

However, the conventional sensing amplifier circuit of FIG. 2 requires 5 additional transistors (versus FIG. 1). Consequently, the circuit of FIG. 2 suffers an increase of an area occupied by the sensing amplifier circuit in comparison to a indirect system of FIG. 1 because the data bus part of FIG. 2 is divided into the read data bus part and the write data bus part and the control connections of the reading and writing operations are separated.

SUMMARY OF THE INVENTION

Accordingly, the present invention is directed to a sensing circuit that substantially obviates one or more of the problems due to limitations and disadvantages of the related art.

An object of the present invention is to provide a sensing circuit in which a semidirect sensing system having a reduced transistor count, which simplifies the sensing circuit system.

To achieve these and other advantages, the present invention provides a semidirect sensing circuit that comprises: a data bus having plural data lines for reading operations and writing operations, respectively; a reading operation circuit connected between a bit line and said data bus and between a bit bar line and said data bus, for performing an indirect reading operation; and a writing operation circuit connected between a bit line and said data bus and between a bit bar line and said data bus, for performing a direct writing operation.

The foregoing and other objectives of the present invention will become more apparent from the detailed description given hereinafter. It should be understood, however, that the detailed description and specific examples, while indicating preferred embodiments, are given by way of illustration only, because various changes and modifications within the spirit and scope of the invention will become apparent to those skilled in the art from this detailed description and specific examples.

BRIEF DESCRIPTION OF THE DRAWINGS

The accompanying drawings, which are included to provide a further understanding of the invention and are incorporated in and constitute a part of this specification, illustrate exemplary embodiments of the invention and But do not limit the invention.

In the drawings:

FIG. 3 illustrates a semidirect sensing circuit in accordance with a preferred embodiment of the present invention.

DETAILED DESCRIPTION OF THE PREFERRED EMBODIMENT

Figure 1:
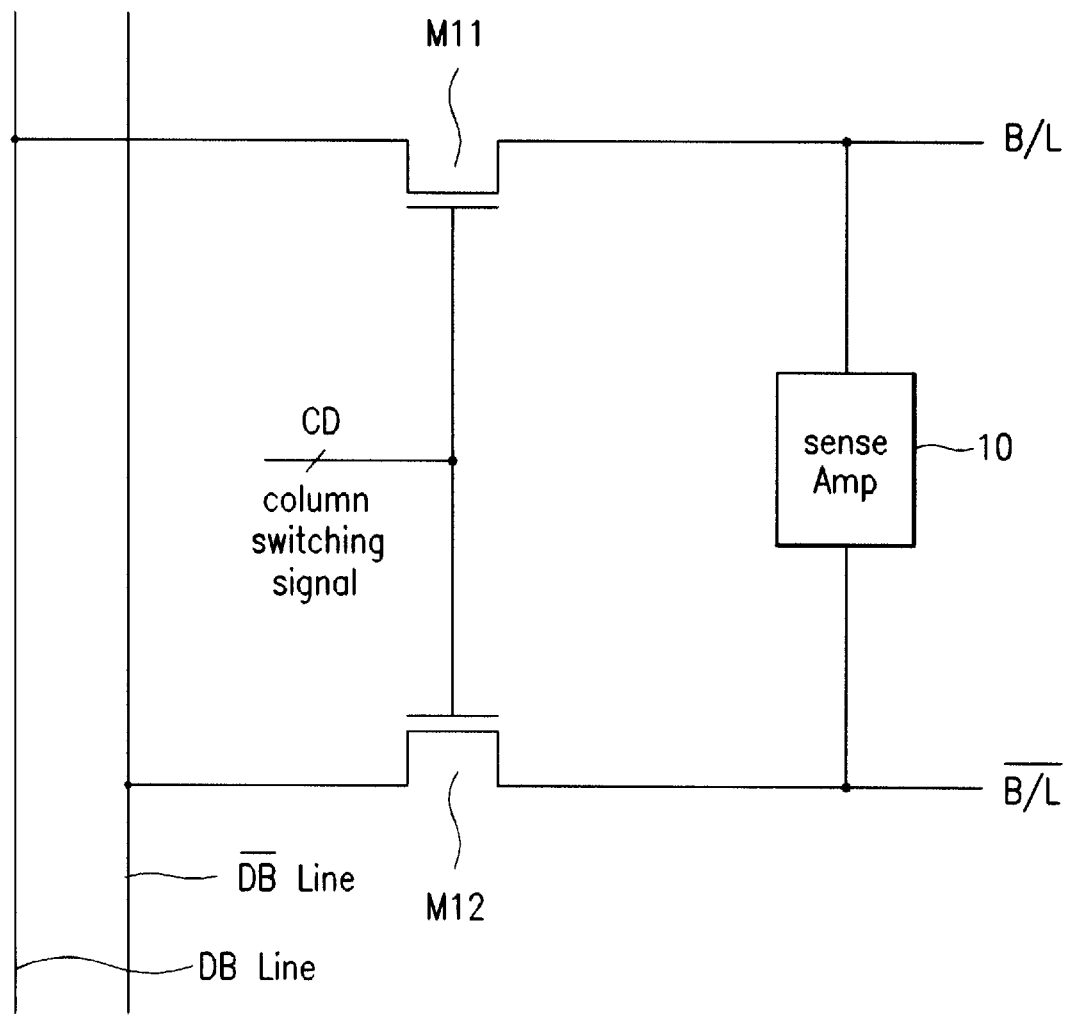
FIG. 1 illustrates a conventional direct sensing circuit.
Figure 2:
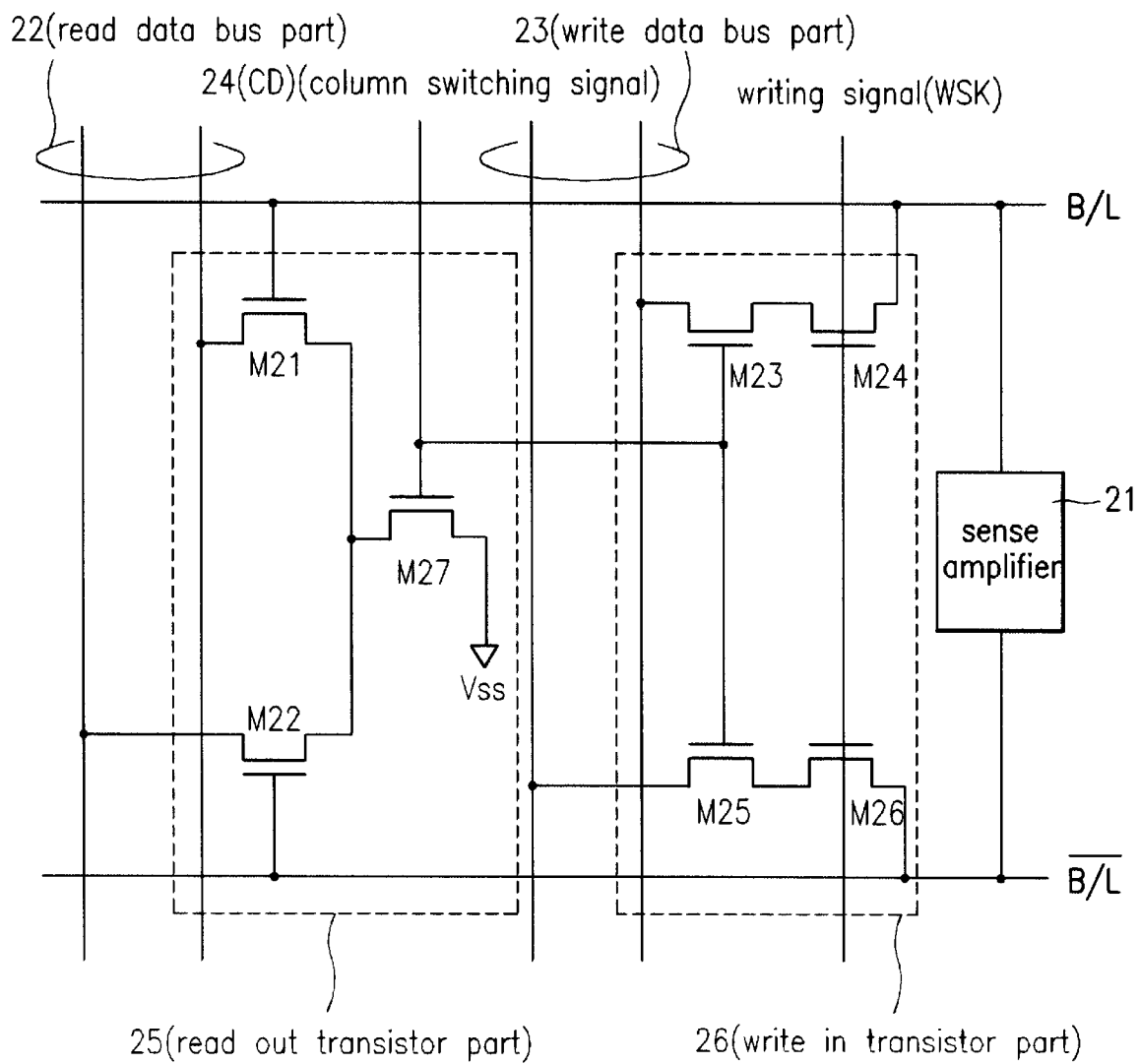
FIG. 2 illustrates a conventional semidirect sensing circuit.

Reference will now be made in detail to the preferred embodiments of the present invention, examples of which are illustrated in the accompanying drawings. FIG. 3 illustrates a semidirect sensing circuit in accordance with a preferred embodiment of the present invention.

The semidirect sensing circuit of the present invention mixes aspects of a direct sensing system and an indirect sensing system.

Referring to FIG. 3, the sensing circuit of the present invention has a bit line (B/L) and a bit bar line (/B/L) each of which is connected to a sensing amplifier 30. There are first and second transistors M31 and M32 for reading, each having a gate connected to the bit line and the bit bar line, respectively and one end connected to lines 31a and 31b, respectively, of a data bus part 31. The other terminals of the first and second transistors M31 and M32 are connected to a fifth transistor M35. The fifth transistor M35 receives a read column decoding (CDR) signal line 32 on its gate, which controls whether the transistors M31 and M32 are connected to ground, i.e., the other end of the fifth transistor M35 is connected to a ground terminal Vss.

The first transistor M31 and the second transistor M32 (connected to the bit line and the bit bar line, respectively) and the fifth transistor M35 are included in a reading operation part 34 of FIG. 3. The reading operation part 34 causes a voltage difference (i.e., one of the two ½ Vcc precharged data lines 31a and 31b is grounded) on the data bus part 31 for making a reading operation.

The third transistor M33 and a fourth transistor M34 of FIG. 3 have their gates commonly connected to a write column decoding (CDW) signal line 33 and their ends connected to the bit line and the bit bar line, respectively. The other end of the third transistor M33 is connected to the data bus line 31a of the data bus part 31 (to which is also connected the first transistor M31) and the other end of the fourth transistor M34 is connected to the data bus line 31b of the data bus part 31 (to which is also connected the second transistor M32). The third transistor M33 and the fourth transistor M34 are included in a writing operation part 35.

The operation of the sensing circuit in accordance with a preferred embodiment of the present invention will be explained with reference to the attached drawing.

The reading operation is carried out by an indirect sensing system, indirect in the sense that the data bus part is never directly connected to the bit lines. For example, upon application of a high datum to the bit line and a low datum to the bit bar line, the high and low data are amplified in the sensing amplifier 30. The read column decoding signal (CDR) transitions from a low signal to a high signal to turn on the fifth transistor M35. In this circumstance, the first transistor M31 (having the high signal applied thereto) is turned on to provide the low datum only to a bus line 31f data bus part 31 (bus line 31b remaining at ½ Vcc). This causes a voltage difference on the data bus part 31. In this circumstance, the write column decoding signal (CDW) 33 is maintained at a low value to keep both the third transistor M33 and the fourth transistor M34 at a turned off state, i.e., so that the data bus part 31 is not connected directly to the bit and bit bar lines through the third and fourth transistors M33 and M34.

The writing operation is carried out by a direct sensing system. The write column decoding signal (CDW) 33 transitions from a low signal to a high signal to turn on the third transistor M33 and the fourth transistor M34. The data on the data bus part is provided to the bit line and the bit bar line by the direct connection through the turned on third and fourth transistors, M33 and M34, respectively. During the writing operation, the read column decoding signal (CDR) is maintained low to maintain the fifth transistor M35 at a turned off state and so prevent a path to ground Vss therethrough.

During the write operation, a current conducting path could exist from the bit line, through the first transistor M31, through the second transistor M32, to the bit bar line. Such a path could only exist if both the bit line and the bit bar line transition to a high signal. As their names reflect, the bit bar line always carries a signal inverse to the signal on the bit line. Consequently, the bar and bit bar lines will never both apply a high signal, so the first transistor M31 and the second transistor M32 will never be turned on at the same time during the writing operation.

The five transistors M31 to M35 of exemplary FIG. 3 have been depicted as NMOS transistors. As an alternative, all of them could be PMOS transistors. As a further alternative, the semidirect sensing circuit could be implemented in CMOS technology. In other words, the present invention is not limited to a particular transistor technology. The changes necessary to adopt an alternative implementation are within the ordinary level of skill in the art.

The sensing circuit of the present invention has the following advantages.

In comparison to the conventional indirect sensing system, the semidirect sensing circuit of the present invention can reduce the number of data lines in the data bus part by a half because the data bus part need not be divided into a separate bus for reading and another bus for writing. Since the number of switches of the transistors can be reduced from the conventional 7 to 5, a device packing density can be made higher.

It will be apparent to those skilled in the art that various modifications and variations can be made in the sensing circuit of the present invention without departing from the spirit or scope of the invention. Thus, it is intended that the present invention cover the modifications and variations of this invention as would be obvious to one of ordinary skill in the art, and it is intended that there modification and variation be included within the scope of the appended claims and their equivalents.

What is claimed is:

1. A semidirect sensing circuit in a DRAM comprising:
   a combined read and write data bus having plural data lines, each said data line being for both reading operations and writing operations;
   a reading operation circuit connected between a bit line and said data bus and between a bit bar line and said data bus, for performing an indirect reading operation; and
   a writing operation circuit, having components distinct from said reading operation circuit and connected between said bit line and said data bus and between said bit bar line and said data bus, for performing a direct writing operation.

2. A sensing circuit as claimed in claim 1, wherein said reading operation circuit includes:

a first transistor for controlling whether said indirect read operation occurs; and a second and third transistor, connected to said data lines, respectively, and each connected to the same end of said first transistor, for selectively connecting one of said data lines to said first transistor.

3. A sensing circuit as claimed in claim 2, wherein said transistors are NMOS transistors.

4. A sensing circuit as claimed in claim 2, wherein said second transistor is connected to a first one of said data lines, said third transistor is connected to a second one of said data lines, the gates of said first and second transistors are connected to said bit and bit bar lines, respectively, and a second end of said first transistor is connected to Vss.

5. A sensing circuit as claimed in claim 4, wherein said gate of said first transistor is connected to a read column decoding signal such that said first transistor is switched ON/OFF thereby.

6. A sensing circuit as claimed in claim 1, wherein said writing operation circuit includes:

a first single transistor for selectively connecting a first data line of said data bus to said bit line; and a second single transistor for selectively connecting a second line of said data bus to said bit bar line.

7. A sensing circuit as claimed in claim 6, wherein said transistors are NMOS transistors.

8. A sensing circuit as claimed in claim 6, wherein said gates of said first and second transistors are connected to a write column decoding signal, respectively, such that said first and second transistors are switched ON/OFF thereby.

9. A sensing circuit as claimed in claim 1, further comprising a sense amplifier connected to said bit line and said bit bar line for sensing said amplifying signals from said bit line and said bit bar line, respectively. data bus, for performing a direct writing operation.

10. A semidirect sensing circuit in a DRAM comprising:

a combined read and write data bus having plural bus lines, each said bus line being used both in a reading operation as well as a writing operation;

a first transistor for controlling said read operation;

a second and third transistor, connected to said data lines, respectively, and each connected to the same end of said first transistor, for selectively connecting one of said data lines to said first transistor;

a single fourth transistor for selectively connecting a first data line of said data bus to said bit bar line; and a single fifth transistor for selectively connecting a second data line of said data bus to said bit bar line.

11. A sensing circuit as claimed in claim 10, wherein said second transistor is connected to a first one of said data lines, said third transistor is connected to a second one of said data lines, the gates of said second and third transistors are connected to said bit and bit bar lines, respectively, and a second end of said first transistor is connected to Vss.

12. A sensing circuit as claimed in claim 11, wherein said transistors are included in a reading operation circuit.

13. A sensing circuit as claimed in claim 10, wherein the gates of said single fourth and single fifth transistors are connected to a write column decoding signal, respectively, such that said fourth and fifth transistors are switched ON/OFF thereby.

14. A sensing circuit as claimed in claim 13, wherein said single fourth and single fifth transistors are included in a writing operation circuit.

15. A sensing circuit as claimed in claim 10, further comprising a sense amplifier connected to said bit line and said bit bar line for sensing said amplifying signals from said bit line and said bit bar line, respectively.

16. A sensing circuit as claimed in claim 10, wherein said transistors are NMOS transistor.

17. A sensing circuit as claimed in claim 10, wherein said transistors are PMOS transistor.

18. A sensing circuit as claimed in claim 10, wherein each of said transistors is one of NMOS and PMOS transistor.

* * * * *